(12) United States Patent
Liaw

(10) Patent No.: US 7,920,403 B2
(45) Date of Patent: Apr. 5, 2011

(54) ROM CELL ARRAY STRUCTURE

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 514 days.

(21) Appl. No.: 12/039,711

(22) Filed: Feb. 28, 2008

(65) Prior Publication Data

US 2008/0170426 A1 Jul. 17, 2008

Related U.S. Application Data

(62) Division of application No. 11/190,992, filed on Jul. 27, 2005, now Pat. No. 7,361,541.

(51) Int. Cl.
*G11C 17/00* (2006.01)
(52) U.S. Cl. .......................................... 365/104; 365/94
(58) Field of Classification Search .................. 365/104, 365/94; 257/508, 288, 401, 499
See application file for complete search history.

(56) References Cited

U.S. PATENT DOCUMENTS

| | | | |
|---|---|---|---|
| 7,701,034 B2 * | 4/2010 | Chuang et al. | 257/508 |
| 2006/0128110 A1 * | 6/2006 | Adachi et al. | 438/400 |
| 2006/0175679 A1 * | 8/2006 | Amishiro et al. | 257/506 |

* cited by examiner

*Primary Examiner* — Vu A Le
(74) *Attorney, Agent, or Firm* — K&L Gates LLP

(57) ABSTRACT

A semiconductor memory cell array is disclosed which comprises an elongated continuous active region, a first transistor formed in the elongated continuous active region, the first transistor forming a first single-transistor memory cell, a second transistor also formed in the elongated continuous active region, the second transistor forming a second single-transistor memory cell and being the closest memory cell to the first single-transistor memory cell along the elongated direction, and an isolation gate formed on the elongated continuous active region between the first and second transistor, wherein the isolation gate has substantially the same structure as gates of the first and second transistor, and is supplied with a predetermined voltage to shut off any active current across a section of the elongated continuous active region beneath the isolation gate.

23 Claims, 4 Drawing Sheets

US 7,920,403 B2

ROM CELL ARRAY STRUCTURE

This application is a DIV of Ser. No. 11/190,992 filed on Jul. 27,2005, now Pat. No. 7,361,541.

BACKGROUND

The present invention relates generally to semiconductor memories, and, more particularly, to semiconductor read-only-memory (ROM) cell array structure.

Semiconductor ROM is a type of solid state memory which is fabricated with desired data permanently stored in it. Each ROM cell has typically just one transistor either in an "on" state or an "off" state when being selected by a word-line and a bit-line. Word-lines are typically coupled to the gates of the cell transistors. Bit-lines are typically coupled to the drains of the cell transistors while sources thereof are coupled typically to a ground (VSS). Then the "on" or "off" state depends on whether the path of the bit-line to the VSS through a particular cell transistor is electrically connected or isolated. Such path can be determined by a mask, such as contact, via or active (OD). For instance, when a source contact to the VSS is absent for a cell transistor, the cell transistor is in an "off" state.

The cell state is detected by a sense amplifier which translate the "on" or "off" state into a logic "1" or a logic "0", respectively, or vice versa. The sense amplifier can detect either voltage or current. A difference, either voltage or current, between the cell transistor's "on" and "off" states should be as large as possible, so that the sense amplifier can quickly and correctly detects the state. In a traditional ROM cell, the difference is largely determined by the cell transistor's channel width and channel length. When processing technology enters nanometer era, the cell transistor's channel width and channel length exhibit a significant sensitivity to its layout environments, among which are poly spacing effect (PSE) and shallow-trench-isolation (STI) stress effect (LOD) and strain effect. These effects may significantly affect the channel width and channel length, and hence lower the cell transistor's sensing margin. Increasing transistor size (cell size) or decreasing memory's operation speed can compensate layout environmental effects, but they impact product cost or performance.

FIG. 1A is a schematic diagram illustrating a conventional ROM cell array which has two exemplary memory cells 110[i] and 110[i+1]. In memory cell 110[i], a NMOS transistor 105[i] has a gate and a drain connected to a word-line (WL[i]) and a bit-line (BL), respectively. A source of the NMOS transistor 105[i] is disconnected from a ground (VSS), i.e., floating, by opening a switch 108[i]. Therefore, when the memory cell 110[i] is selected by activating both the WL[i] and BL, the BL will not detect any current, which may be interpreted as a logic "0". In memory cell 110[i+1], a NMOS transistor 105[i+1] has a gate and a drain connected to a word-line (WL[i+1]) and the same BL, respectively. A source of the NMOS transistor 105[i+1] is connected to the VSS by closing a switch 108[i+1]. Therefore, when the memory cell 110[i+1] is selected by activating both the WL[i+1] and BL, the BL will detect a conduction current of the NMOS transistor 105[i+1], which may be interpreted as a logic "1".

FIG. 1B is a layout diagram illustrating a layout implementation of the conventional ROM cell array of FIG. 1A. The NMOS transistor 110[i] has an active region (OD) 120[i], a polysilicon gate 127[i], and a contact 123[i] connecting a drain of the NMOS transistor 110[i] to the BL (not shown). There is no contact in the source area 125[i] of the NMOS transistor 110[i]. This is a particular implementation of opening the switch 108[i] (referring to FIG. 1A). The NMOS transistor 110[i+1] has an active region (OD) 120[i+1], a polysilicon gate 127[i+1], and a contact 123[i+1] connecting a drain of the NMOS transistor 110[i+1] to the BL (not shown). There is a contact 125[i+1] in the source area of the NMOS transistor 110[i+1]. This is a particular implementation of closing the switch 108[i+1] (referring to FIG. 1A).

Referring again to FIG. 1B, the polysilicon word-lines, WL[i] and WL[i+1], may pose the poly spacing effect. In modern silicon processes, an isolation between the OD regions, 120[i] and 120[i+1], is performed by a shallow-trench-isolation (STI), which poses stress effect and strain effect, as the spacing between the OD regions, 120[i] and 120[i+1] is kept at minimum for reducing die size. As discussed earlier, these layout related effects may adversely affect the sensing margins of the memory cells. As such what is desired is ROM cell structure that can alleviate such layout related effects without significantly increasing the size or decreasing the speed of the ROM cell array.

SUMMARY

In view of the foregoing, the present invention provides a semiconductor memory cell array which comprises an elongated continuous active region, a first transistor formed in the elongated continuous active region, the first transistor forming a first single-transistor memory cell, a second transistor also formed in the elongated continuous active region, the second transistor forming a second single-transistor memory cell and being the closest memory cell to the first single-transistor memory cell along the elongated direction, and an isolation gate formed on the elongated continuous active region between the first and second transistor, wherein the isolation gate has substantially the same structure as gates of the first and second transistor, and is supplied with a predetermined voltage to shut off any active current across a section of the elongated continuous active region beneath the isolation gate.

According to one aspect of the present invention, states of a memory cell are determined by whether contacts from a source of the memory cell to the VSS are present or not.

According to another aspect of the present invention, states of a memory cell are determined by whether vias connecting a source of the memory cell to the VSS are present or not.

According to yet another aspect of the present invention, states of a memory cell are determined by whether contacts from a drain of the memory cell to a corresponding bit-line are present or not.

According to yet another aspect of the present invention, states of a memory cell are determined by whether vias connecting a drain of the memory cell to a corresponding bit-line are present or not.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of a ROM cell array structure that replaces the shallow-trench-isolation (STI) between two adjacent memory cells in a bit-line (BL) direction with a permanently-off transistor in accordance with the present invention.

Figure 1A:
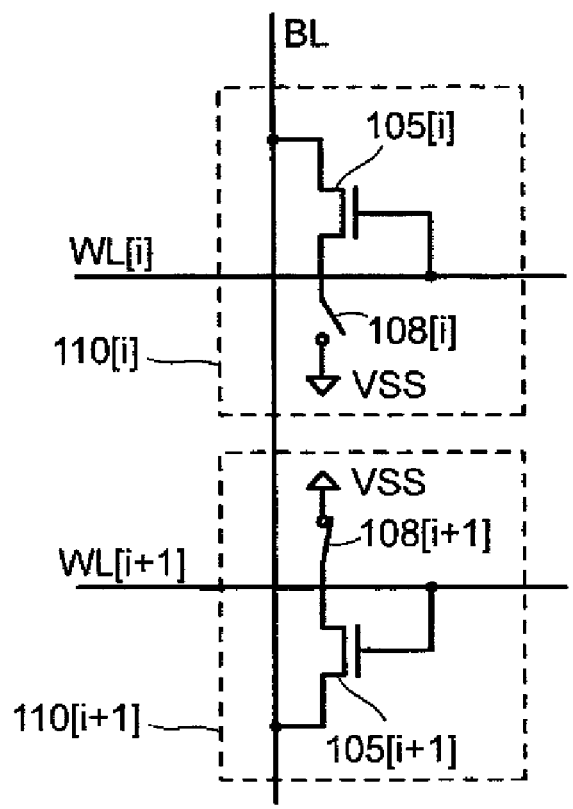
FIG. 1A is a schematic diagram illustrating a conventional ROM cell array.
Figure 2A:
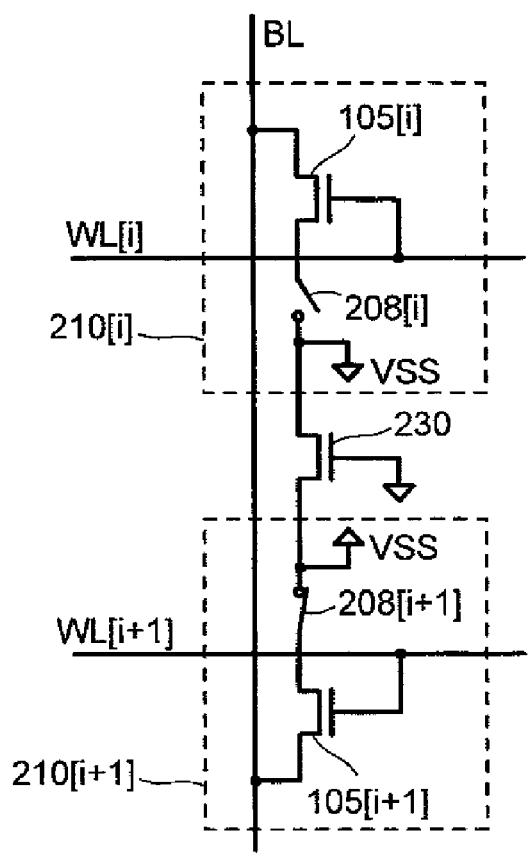
FIG. 2A is a schematic diagram illustrating a ROM cell array according to a first embodiment of the present invention.

FIG. 2A is a schematic diagram illustrating a ROM cell array according to a first embodiment of the present invention which comprises a NMOS transistor 230 between two adjacent memory cells 210[i] and 210[i+1] in a BL direction. The memory cells 210[i] and 210[i+1] are the same as the conventional memory cells 110[i] and 110[i+1], respectively, as depicted in FIG. 1A, and require no further discussion here. A gate of the NMOS transistor 230 is connected to the VSS. A source and a drain of the NMOS transistor 230 is connected to the VSS of the memory cells 210[i] and 210[i+1], respectively. Therefore, the NMOS transistor 230 is permanently in an off state, and does not perform any electronic function in the ROM cell array. The presence of the NMOS transistor 230, however, provides layout benefits thereto.

Figure 1B:
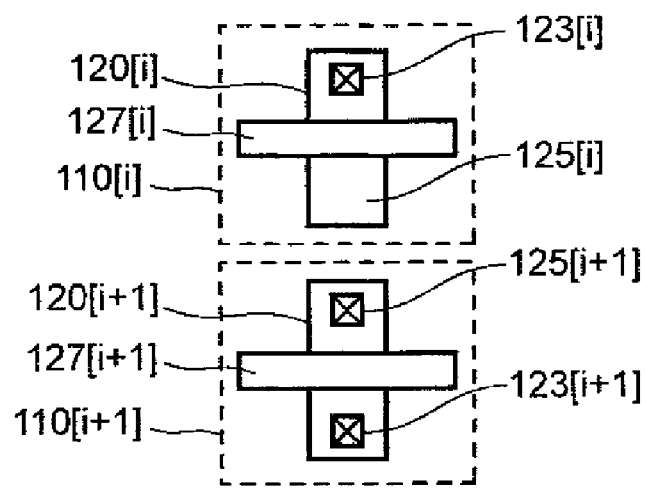
FIG. 1B is a layout diagram illustrating a layout implementation of the conventional ROM cell array of FIG. 1A.
Figure 2B:
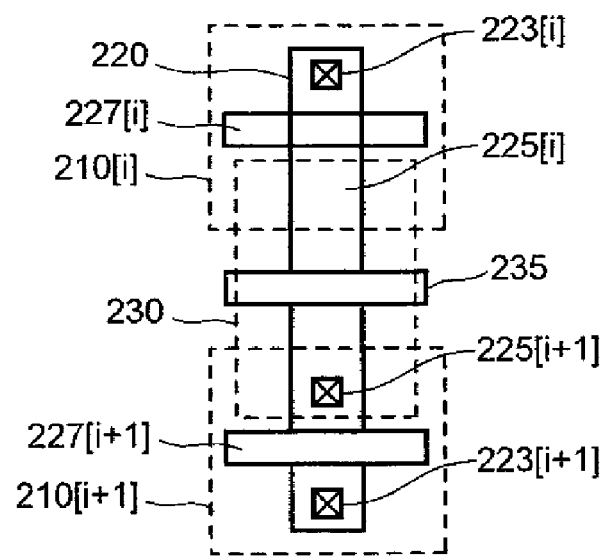
FIG. 2B is a layout diagram illustrating a layout implementation of the ROM cell array of FIG. 2A.

FIG. 2B is a layout diagram illustrating a layout implementation of the ROM cell array of FIG. 2A. Here a continuous active (OD) region 220 runs through the memory cells 210[i] and 210[i+1] in the BL direction. A polysilicon gate 235, which is applied the VSS, serves to separate the two memory transistors 210[i] and 210[i+1]. In the convention ROM cell array as shown in FIG. 1B, such separation is achieved by a shallow-trench-isolation (STI), which has stress and strain effects due to the close proximity of the OD regions 120[i] and 120[i+1]. With the STI region being eliminated in the memory cell array structure of FIG. 2B, so are the STI stress and strain effects in this area. Besides, with the addition of the polysilicon gate 235, the polysilicon placement is more evenly spaced across the entire ROM cell array of FIG. 2B, therefore, the memory cell array structure according to the first embodiment of the present invention has less poly spacing effect.

Referring again to FIG. 2B, other layout features, such as polysilicon gates 227[i] and 227[i+1] and contacts 223[i], 223[i+1] and 225[i+1] of FIG. 2B, are identical to the corresponding layout features of FIG. 1B, and require no further discussion. Essentially, a ROM cell state is determined by whether a VSS-to-source contact is present or not. For instance, there is no VSS-to-source contact for the memory cell 210[i] which is then in the "off" state when being addressed or selected. In contrast, there is a VSS-to-source contact 225[i+1] for the memory cell 210[i+1] which is then in the "on" state when being addressed or selected.

Figure 3A:
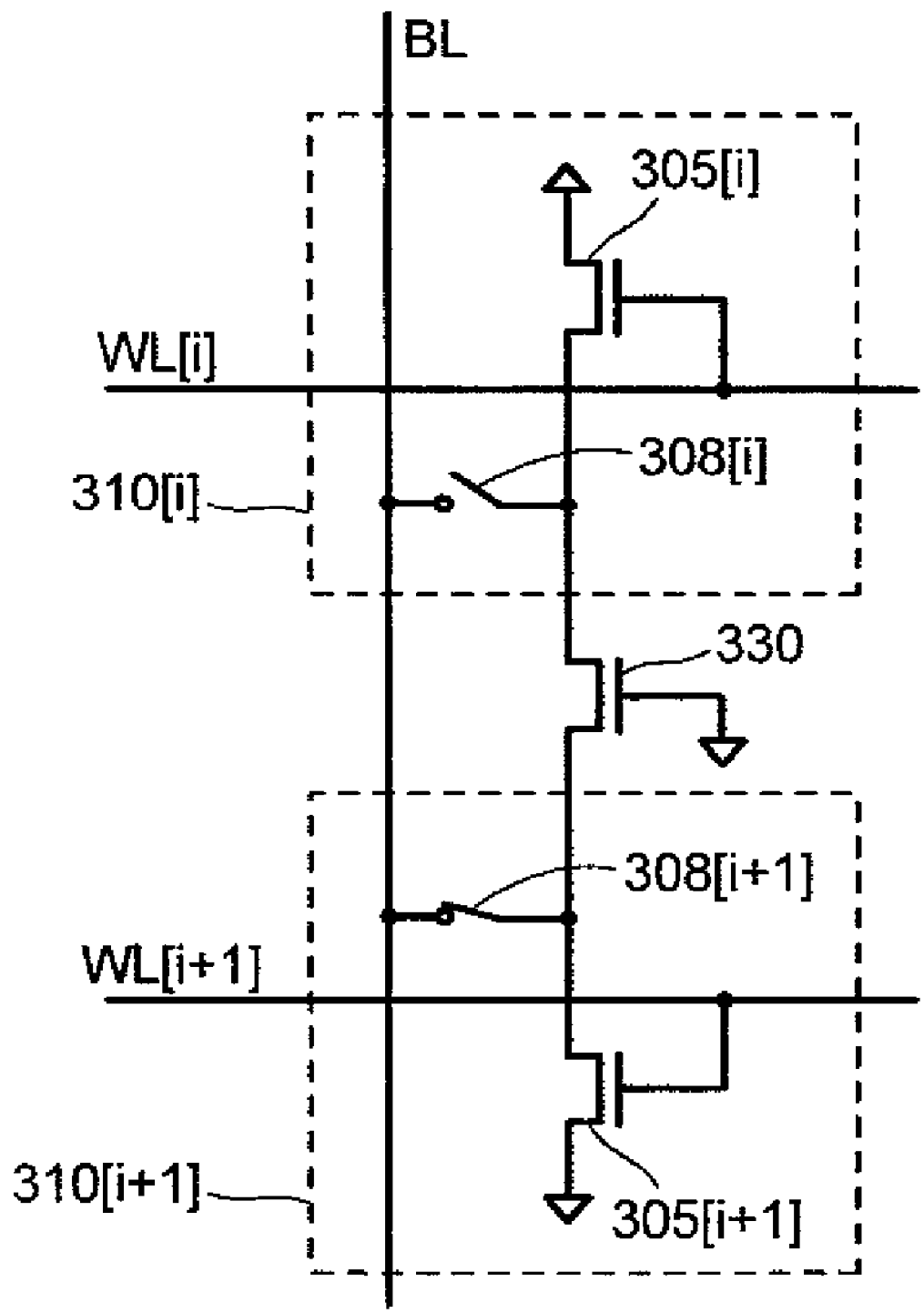
FIG. 3A is a schematic diagram illustrating a ROM cell array according to a second embodiment of the present invention.

FIG. 3A is a schematic diagram illustrating a ROM cell array according to a second embodiment of the present invention. The second embodiment differs from the first embodiment in that instead of a source of a memory cell transistor being disconnected from the VSS for altering the memory cell state in FIG. 2A, a drain of a memory cell transistor is disconnected from the BL in FIG. 3A for altering the memory cell state.

Referring again to FIG. 3A, a memory cell 310[i] has a NMOS transistor 305[i], a source and a gate of which are connected to the VSS and WL[i], respectively. A drain of the NMOS transistor 305[i] is disconnected from the BL by a switch 308[i]. Therefore, no current can be read out when the memory cell 310[i] is selected, and the memory cell 310[i] represents an "off" state. An adjacent memory cell 310[i+1] has a NMOS transistor 305[i+1], a source and a gate of which are connected to the VSS and WL[i+1], respectively. A drain of the NMOS transistor 305[i+1] is connected to the BL by a switch 308[i+1]. Therefore, a current will be read out when the memory cell 310[i+1] is selected, and the memory cell 310[i+1] represents an "on" state.

Referring again to FIG. 3A, the gate of the isolation NMOS transistor 330 is permanently connected to the VSS. Therefore, the NMOS transistor 330 is always off and effectively isolates the drains of the adjacent NMOS transistors 205[i] and 205[i+1].

Figure 3B:
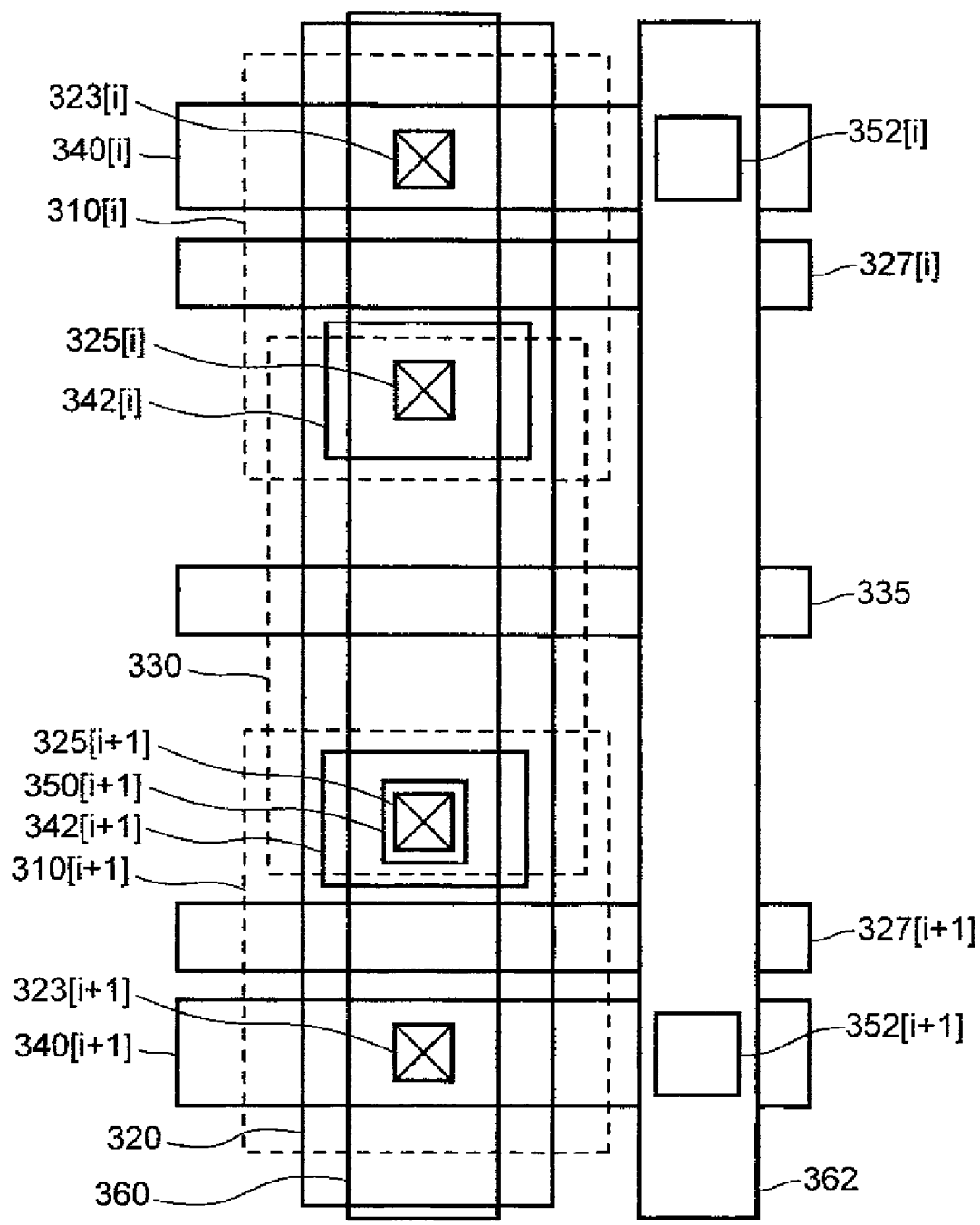
FIG. 3B is a layout diagram illustrating a layout implementation of the ROM cell array of FIG. 3A.

FIG. 3B is a layout diagram illustrating a layout implementation of the ROM cell array of FIG. 3A. A continuous OD region 320 runs though the adjacent NMOS transistors 310[i] and 310[i+1]. The NMOS transistor 310[i] has a polysilicon gate 327[i], a source contact 323[i] and a drain contact 325[i]. A metal 1 horizontal line 340[i] makes contact to the source contact 323[i]. A metal 2 vertical line 362 makes contact to the metal 1 horizontal line 340[i] through a via 352[i]. The metal 2 vertical line 362 is eventually connected to the VSS. The drain contact 325[i] is connected to a metal 1 landing pad 342[i]. A metal 2 vertical line 360, serving as the BL, runs on top of the OD region 320. But there is no via for connecting metal 2 vertical line 360 to the metal 1 landing pad 342[i]. Therefore, the drain of the NMOS transistor 310[i] is not connected to the BL, i.e., the switch 308[i] of FIG. 3A is implemented by the absence of a via between the BL 360 and the drain landing pad 342[i]. Similarly, the NMOS transistor 310[i+1] has a polysilicon gate 327[i+1], a source contact 323[i+1] and a drain contact 325[i+1]. A metal 1 horizontal line 340[i+1] makes contact to the source contact 323[i+1]. the metal 2 vertical line 362 makes contact to the metal 1 horizontal line 340[i] through a via 352[i+1] to connect the source of the NMOS transistor 310[i+1] to the VSS. The drain contact 325[i+1] is connected to a metal 1 landing pad 342[i+1]. The metal 2 BL 360 is connected to the metal 1 landing pad 342[i+1] through a via 350[i+1]. Therefore, the drain of the NMOS transistor 310[i+1] is connected to the BL, i.e., the switch 308[i+1] of FIG. 3A is implemented by the presence of the via 350[i+1] between the BL 360 and the drain landing pad 342[i+1].

Referring again to FIG. 3B, a polysilicon horizontal line 335, which is connected to the VSS (not shown), is placed between drain contacts 325[i] and 325[i+1] of the adjacent NMOS transistors 310[i] and 310[i+1]. The polysilicon horizontal line 335 is the gate of the isolation NMOS transistor 330, and effectively isolates the adjacent NMOS transistors 310[i] and 310[i+1]. Similar to the ROM cell array shown in FIG. 2B, the continuous OD region 320 eliminates the between-memory-cells STI stress and strain effects that are present in the conventional ROM cell array shown in FIG. 1B. The addition of the polysilicon horizontal line 335 in the ROM cell array of FIG. 3B makes the polysilicon more evenly spaced and hence alleviates the poly spacing effect.

Although the VSS has been described to turn off the isolation NMOS transistor 230 of FIG. 2A or 330 of FIG. 3A, a skilled artisan would realized that any other voltage that is lower than the threshold voltage of the NMOS transistor 230 or 330, the NMOS transistor 230 or 330 can be turned off and effectively perform the isolation function. Although only NMOS type ROM cell arrays are described, a skilled artisan may appreciate that the essence of the present invention, i.e., using permanently-off active device in place of STI to isolate adjacent two memory cells in BL direction, can be equally well applied to PMOS type ROM cell arrays. A skilled artisan may also realize that replacing the STI with a polysilicon isolation gate will not significantly affect the die size of the ROM cell array.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor memory cell array comprising:
   an elongated continuous active region;
   a first transistor formed in the elongated continuous active region, the first transistor forming a first single-transistor memory cell;
   a second transistor also formed in the elongated continuous active region, the second transistor forming a second single-transistor memory cell and being the closest memory cell to the first single-transistor memory cell along the elongated direction; and
   an isolation gate formed on the elongated continuous active region between the first and second transistor,
   wherein the isolation gate has substantially the same structure as gates of the first and second transistor, and is coupled to a predetermined voltage to shut off any active current across a section of the elongated continuous active region beneath the isolation gate, thereby electrically isolating the first memory cell from the second memory cell.

2. The semiconductor memory cell array of claim 1, wherein the first and second transistors are NMOS transistors and the predetermined voltage is a ground (VSS).

3. The semiconductor memory cell array of claim 1, wherein the gates of the first and second transistors as well as the isolation gate is formed by polysilicon.

4. The semiconductor memory cell array of claim 1 further comprising a bit-line running in the elongated direction, the bit-line being connected to drains of the first and second transistor while a source of the first transistor is connected to the predetermined voltage and a source of the second transistor is not connected to the predetermined voltage.

5. The semiconductor memory cell array of claim 4, wherein the source of the first transistor is connected to the predetermined voltage by one or more contacts, and there is no contact for the source of the second transistor.

6. The semiconductor memory cell array of claim 4, wherein the source of the first transistor is connected to the predetermined voltage by one or more contacts from the source of the first transistor to a first metal region in a first metal layer and one or more vias between the first metal region of the first metal layer and a second metal region in a second metal layer; and the source of the second transistor is not connected to the predetermined voltage due to the absence of vias in a desired connection path from the source of the second transistor to the predetermined voltage.

7. The semiconductor memory cell array of claim 6, wherein the bit-line is formed on the second metal layer; and the second metal region is an elongated metal region and runs substantially parallel to the bit-line.

8. The semiconductor memory cell array of claim 1 further comprising a bit-line running in the elongated direction, the bit-line being connected to a drain of the first transistor but not being connected to a drain of the second transistor while sources of the first transistor and second transistors are connected to the predetermined voltage.

9. The semiconductor memory cell array of claim 8, wherein the drain of the first transistor is connected to the bit-line by one or more contacts, and there is no contact for the drain of the second transistor.

10. The semiconductor memory cell array of claim 8, wherein the drain of the first transistor is connected to the bit-line by one or more contacts from the drain of the first transistor to a third metal region in a third metal layer and one or more vias between the third metal region of the third metal layer and a fourth metal region in a fourth metal layer; and the drain of the second transistor is not connected to the bit-line due to the absence of vias in a desired connection path from the drain of the second transistor to the bit-line.

11. The semiconductor memory cell array of claim 10, wherein the bit-line is formed on the fourth metal layer; and the fourth metal region is an elongated metal region and runs substantially parallel to the bit-line.

12. The semiconductor memory cell array of claim 1, wherein the semiconductor memory is a read only memory.

13. A semiconductor read-only-memory cell array comprising:
    an elongated continuous active region;
    a first transistor formed in the elongated continuous active region, the first transistor forming a first single-transistor memory cell;
    a second transistor also formed in the elongated continuous active region, the second transistor forming a second single-transistor memory cell and being the closest memory cell to the first single-transistor memory cell along the elongated direction; and
    an isolation gate formed on the elongated continuous active region between the first and second transistor,
    wherein the isolation gate has substantially the same structure as gates of the first and second transistor, and is coupled to a predetermined voltage to shut off any active current across a section of the elongated continuous active region beneath the isolation gate, thereby electrically isolating the first memory cell from the second memory cell.

14. The semiconductor read-only-memory cell array of claim 13, wherein the first and second transistors are NMOS transistors and the predetermined voltage is a ground (VSS).

15. The semiconductor read-only-memory cell array of claim 13, wherein the gates of the first and second transistors as well as the isolation gate is formed by polysilicon.

16. The semiconductor read-only-memory cell array of claim 13 further comprising a bit-line running in the elongated direction, the bit-line being connected to drains of the first and second transistor while a source of the first transistor is connected to the predetermined voltage and a source of the second transistor is not connected to the predetermined voltage.

17. The semiconductor read-only-memory cell array of claim 16, wherein the source of the first transistor is connected to the predetermined voltage by one or more contacts, and there is no contact for the source of the second transistor.

18. The semiconductor read-only-memory cell array of claim 16, wherein the source of the first transistor is connected to the predetermined voltage by one or more contacts from the source of the first transistor to a first metal region in a first metal layer and one or more vias between the first metal region of the first metal layer and a second metal region in a second metal layer; and the source of the second transistor is not connected to the predetermined voltage due to the absence of vias in a desired connection path from the source of the second transistor to the predetermined voltage.

19. The semiconductor read-only-memory cell array of claim 18, wherein the bit-line is formed on the second metal layer; and the second metal region is an elongated metal region and runs substantially parallel to the bit-line.

20. The semiconductor read-only-memory cell array of claim 13 further comprising a bit-line running in the elongated direction, the bit-line being connected to a drain of the first transistor but not being connected to a drain of the second transistor while sources of the first transistor and second transistors are connected to the predetermined voltage.

21. The semiconductor read-only-memory cell array of claim 20, wherein the drain of the first transistor is connected to the bit-line by one or more contacts, and there is no contact for the drain of the second transistor.

22. The semiconductor read-only-memory cell array of claim 20, wherein the drain of the first transistor is connected to the bit-line by one or more contacts from the drain of the first transistor to a third metal region in a third metal layer and one or more vias between the third metal region of the third metal layer and a fourth metal region in a fourth metal layer; and the drain of the second transistor is not connected to the bit-line due to the absence of vias in a desired connection path from the drain of the second transistor to the bit-line.

23. The semiconductor read-only-memory cell array of claim 22, wherein the bit-line is formed on the fourth metal layer; and the fourth metal region is an elongated metal region and runs substantially parallel to the bit-line.

* * * * *